(12) United States Patent
Cox et al.

(10) Patent No.: US 7,608,380 B2
(45) Date of Patent: *Oct. 27, 2009

(54) SPIN BOWL COMPATIBLE POLYAMIC ACIDS/IMIDES AS WET DEVELOPABLE POLYMER BINDERS FOR ANTI-REFLECTIVE COATINGS

(75) Inventors: Robert Christian Cox, St. James, MO (US); Charles J. Neef, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/264,858

(22) Filed: Nov. 2, 2005

(65) Prior Publication Data

US 2006/0063106 A1    Mar. 23, 2006

Related U.S. Application Data

(60) Continuation of application No. 10/842,997, filed on May 11, 2004, now abandoned, which is a division of application No. 10/180,624, filed on Jun. 25, 2002.

(60) Provisional application No. 60/349,569, filed on Jan. 17, 2002.

(51) Int. Cl.
*G03C 1/825* (2006.01)
*G03C 1/835* (2006.01)
*G03F 7/09* (2006.01)
*G03F 7/20* (2006.01)
*G03F 7/30* (2006.01)

(52) U.S. Cl. .............. 430/270.1; 430/271.1; 430/272.1; 430/325; 430/326; 430/950

(58) Field of Classification Search .................. None
See application file for complete search history.

(56) References Cited

U.S. PATENT DOCUMENTS

| | | | | |
|---|---|---|---|---|
| 4,667,010 | A | * | 5/1987 | Eldin ........................... 528/125 |
| 4,742,152 | A | | 5/1988 | Scola |
| 4,803,147 | A | | 2/1989 | Mueller et al. |
| 4,910,122 | A | | 3/1990 | Arnold et al. |
| 4,927,736 | A | | 5/1990 | Mueller et al. |
| 5,057,399 | A | | 10/1991 | Flaim et al. |
| 5,089,593 | A | | 2/1992 | Fjare et al. |
| 5,304,626 | A | | 4/1994 | Burgess et al. |
| 5,336,925 | A | * | 8/1994 | Moss et al. ................ 257/643 |
| 5,340,684 | A | | 8/1994 | Hayase et al. |
| 5,397,684 | A | | 3/1995 | Hogan et al. |
| 5,688,987 | A | | 11/1997 | Meador et al. |
| 5,772,925 | A | | 6/1998 | Watanabe et al. |
| 5,892,096 | A | | 4/1999 | Meador et al. |
| 5,952,448 | A | | 9/1999 | Lee et al. |
| 5,998,569 | A | | 12/1999 | Hogan et al. |
| 6,162,580 | A | * | 12/2000 | Matsuoka et al. ......... 430/283.1 |
| 6,455,416 | B1 | * | 9/2002 | Subramanian et al. ...... 438/636 |
| 7,265,431 | B2 | | 9/2007 | Sivakumar ................... 257/437 |
| 2002/0120091 | A1 | | 8/2002 | Scott |
| 2002/0160211 | A1 | | 10/2002 | Kurita et al. |
| 2003/0049566 | A1 | * | 3/2003 | Sabnis et al. ................ 430/311 |
| 2004/0010062 | A1 | | 1/2004 | Ahn et al. |

FOREIGN PATENT DOCUMENTS

| | | |
|---|---|---|
| JP | 48000891 | 1/1973 |
| JP | 9-78031 | 3/1997 |
| JP | 10307394 | 11/1998 |

OTHER PUBLICATIONS

Ho et al ("Synthesis and Characteristics of Organic Soluble Photoactive Polyimides", Journal of Applied Polymer Science, vol. 53, p. 1513-1524 (1994).*

* cited by examiner

*Primary Examiner*—Sin J. Lee
(74) *Attorney, Agent, or Firm*—Hovey Williams LLP

(57) ABSTRACT

Anti-reflective compositions and methods of using these compositions to form circuits are provided. The compositions comprise a polymer dissolved or dispersed in a solvent system. In a preferred embodiment, the polymers are copolymers of a compound having the formulas

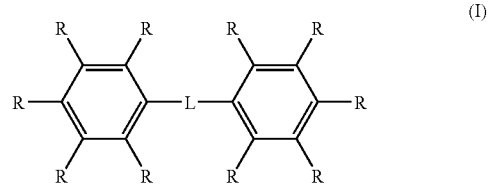

and a compound having the formula

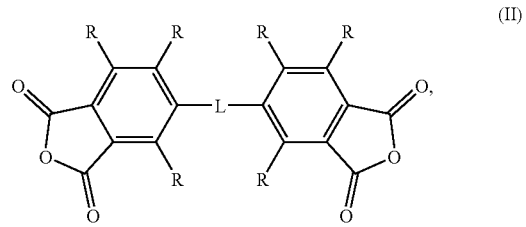

where: (1) each R is individually selected from the group consisting of —OH, —NH$_2$, hydrogen, aliphatics, and phenyls; and (2) L is selected from the group consisting of —SO$_2$— and —CR'$_2$—. The resulting compositions are spin bowl compatible (i.e., they do not crosslink prior to the bake stages of the microlithographic processes or during storage at room temperature), are wet developable, and have superior optical properties.

25 Claims, 2 Drawing Sheets

Prior Art

SPIN BOWL COMPATIBLE POLYAMIC ACIDS/IMIDES AS WET DEVELOPABLE POLYMER BINDERS FOR ANTI-REFLECTIVE COATINGS

RELATED APPLICATIONS

This is a continuation of U.S. patent application Ser. No. 10/842,997 filed May 11, 2004, incorporated by reference herein, now abandoned, which is a divisional of U.S. patent application Ser. No. 10/180,624 filed Jun. 25, 2002, incorporated by reference herein. U.S. patent application Ser. No. 10/180,624 claims priority benefit of a provisional application entitled SPIN BOWL COMPATIBLE POLYAMIC ACIDS/IMIDES AS WET DEVELOPABLE POLYMER BINDERS FOR BARCS, Ser. No. 60/349,569, filed Jan. 17, 2002, incorporated by reference herein.

BACKGROUND OF THE INVENTION

1. Field of the Invention

The present invention is concerned with new polymers and anti-reflective compositions for use in the manufacture of microelectronic devices. These compositions include a polyamic acid and are developable in aqueous photoresist developers.

2. Description of the Prior Art

Integrated circuit manufacturers are consistently seeking to maximize substrate wafer sizes and minimize device feature dimensions in order to improve yield, reduce unit case, and increase on-chip computing power. Device feature sizes on silicon or other chips are now submicron in size with the advent of advanced deep ultraviolet (DUV) microlithographic processes.

However, a frequent problem encountered by photoresists during the manufacture of semiconductor devices is that activating radiation is reflected back into the photoresist by the substrate on which it is supported. Such reflectivity tends to cause blurred patterns which degrade the resolution of the photoresist. Degradation of the image in the processed photoresist is particularly problematic when the substrate is non-planar and/or highly reflective. One approach to address this problem is the use of an anti-reflective coating applied to the substrate beneath the photoresist layer. While anti-reflective coatings are effective at preventing or minimizing reflection, their use requires an additional break-through step in the process in order to remove the coatings. This necessarily results in an increased process cost.

One solution to this problem has been the use of wet developable anti-reflective coatings. These types of coating can be removed along with the exposed areas of the photoresist material. That is, after the photoresist layer is exposed to light through a patterned mask, the exposed areas of the photoresist are wet developable and are subsequently removed with an aqueous developer to leave behind the desired trench and hole pattern. Wet developable anti-reflective coatings are removed during this developing step, thus eliminating the need for an additional removal step. Unfortunately, wet developable anti-reflective coatings have not seen widespread use due to the fact that they must also exhibit good spin bowl compatibility and superior optical properties to be useful as an anti-reflective coating. Thus, there is a need for anti-reflective coating compositions which are removed by conventional photoresist developers while simultaneously exhibiting good coating and optical properties.

SUMMARY OF THE INVENTION

The present invention broadly comprises microlithographic compositions (and particularly anti-reflective coating compositions) that are useful in the manufacture of microelectronic devices.

In more detail, the compositions comprise a polymer dispersed or dissolved in a solvent system. In one embodiment, the preferred polymers are polyamic acids. The polyamic acids preferably include recurring monomers having the formulas

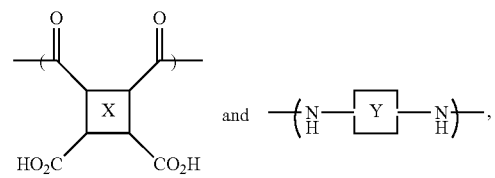

where each of

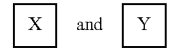

individually an aryl or aliphatic group.

In this embodiment, the polyamic acids are preferably formed by polymerizing a dianhydride with a diamine. Preferred dianhydrides have the formula

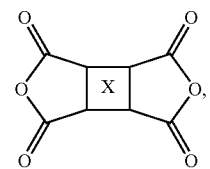

where

represents an aryl or aliphatic group.

Particularly preferred dianhydrides are:

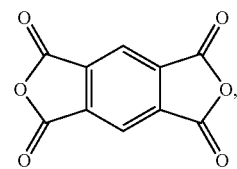

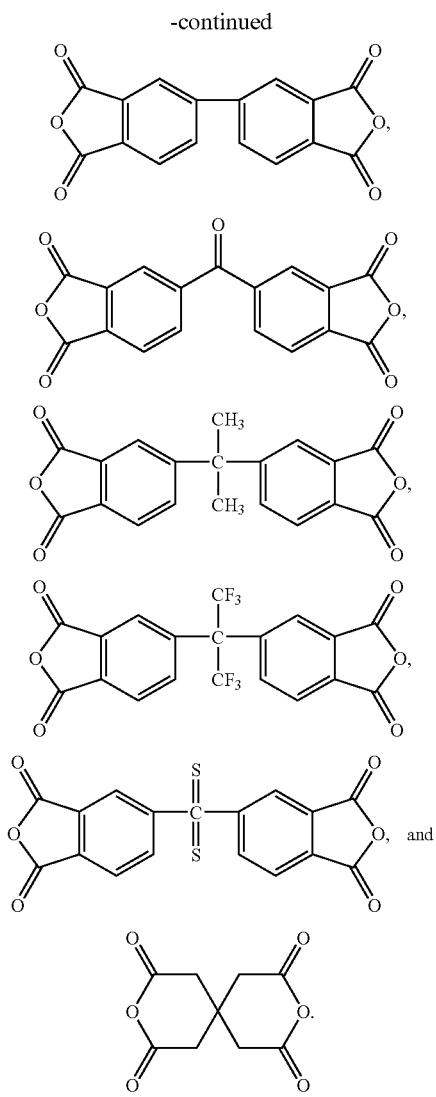

Preferred diamines have the formula

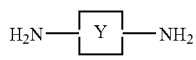

where

represents an aryl or aliphatic group.
Particularly preferred diamines are:

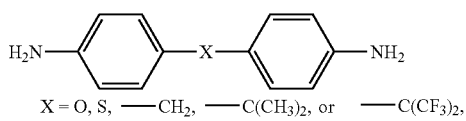

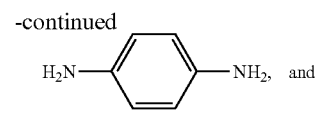

In another preferred embodiment, the preferred polymers include recurring monomers having the formulas

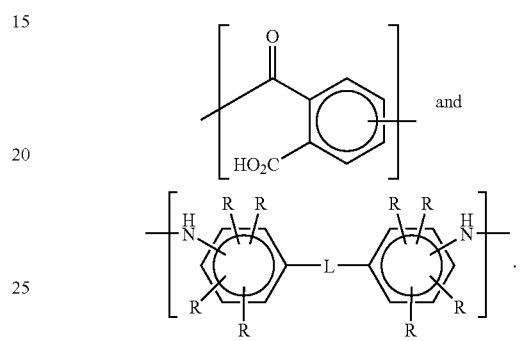

In the foregoing formulas, each R is individually selected from the group consisting of hydrogen, —OH, aliphatics, and phenyls. Preferred aliphatics are $C_1$-$C_8$ branched and unbranched alkyl groups such as t-butyl and isopropyl groups.

L is selected from the group consisting of —$SO_2$— and —$CR'_2$—. When L is —$CR'_2$—, then each R' is individually selected from the group consisting of hydrogen, aliphatics (preferably $C_1$-$C_8$ branched and unbranched alkyls), and phenyls, and —$CX_3$. In embodiments where R' is —$CX_3$, each X is individually selected from the group consisting of the halogens, with fluorine and chlorine being the most preferred halogens.

In yet another embodiment, the polymers are formed by polymerizing a compound having the formula

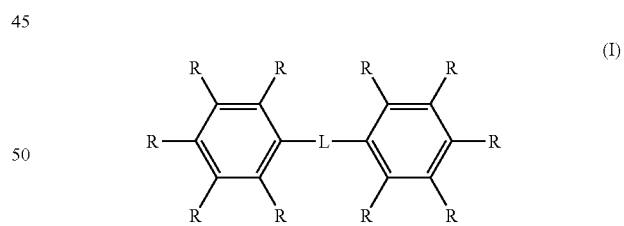

with a compound having the formula

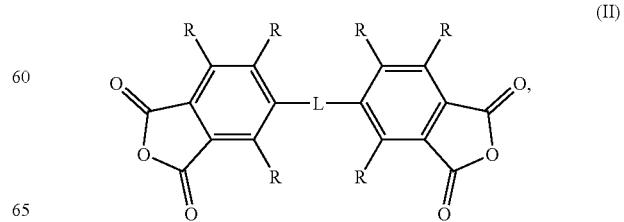

In the formulas of this embodiment, each R is individually selected from the group consisting of —OH, —NH$_2$, hydrogen, aliphatics, and phenyls. Again, as with the first embodiment, preferred aliphatics are C$_1$-C$_8$ branched and unbranched alkyl groups such as t-butyl and isopropyl groups. Furthermore, it is preferred that at least one R on each ring of (I) be —NH$_2$.

L is preferably selected from the group consisting of —SO$_2$— and —CR'$_2$—, where each R' is individually selected from the group consisting of hydrogen, aliphatics (preferably C$_1$-C$_8$ branched and unbranched alkyl groups), phenyls, and —CX$_3$. When L is —CX$_3$, each X is individually selected from the group consisting of the halogens.

Regardless of the embodiment, the compositions are formed by simply dispersing or dissolving the polymers in a suitable solvent system, preferably at ambient conditions and for a sufficient amount of time to form a substantially homogeneous dispersion. The polymer should be present in the composition at a level of 1-100% by weight, more preferably from about 20-80% by weight, and more preferably from about 40-60% by weight, based upon the total weight of solids in the composition taken as 100% by weight. The weight average molecular weight of this polymer is preferably from about 2,000-1,000,000 Daltons, more preferably from about 5,000-500,000 Daltons, and even more preferably from about 10,000-100,000 Daltons.

Preferred solvent systems include a solvent selected from the group consisting of propylene glycol methyl ether acetate (PGMEA), propylene glycol methyl ether (PGME), and mixtures thereof. The solvent system should have a boiling point of from about 50-250° C., and more preferably from about 150-200° C., and should be utilized at a level of from about 50-99% by weight, and preferably from about 90-98% by weight, based upon the total weight of the solids in the composition taken as 100% by weight.

Any other ingredients should be dissolved or dispersed in the solvent system along with the polymer. One such ingredient is a crosslinking agent. Preferred crosslinking agents include aminoplasts (e.g., POWDERLINK® 1174, Cymel® products) and epoxies. The crosslinking agent should be present in the composition at a level of from about 0-50% by weight, and preferably from about 10-20% by weight, based upon the total weight of the solids in the composition taken as 100% by weight. Thus, the compositions of the invention should crosslink at a temperature of from about 100-250° C., and more preferably from about 150-200° C.

It is preferred that the compositions also include a light attenuating compound or chromophore. The light attenuating compound should be present in the composition at a level of from about 0-50% by weight, and preferably from about 15-30% by weight, based upon the total weight of solids in the composition taken as 100% by weight. The light attenuating compound should be selected based upon the wavelength at which the compositions will be processed. Thus, at wavelengths of 248 nm, preferred light attenuating compounds include napthalenes and anthracenes, with 3,7-dihydroxy-2-napthoic acid being particularly preferred. At wavelengths of 365 nm, preferred light attenuating compounds include diazo dyes and highly conjugated phenolic dyes. At wavelengths of 193 nm, preferred light attenuating compounds include compounds containing phenyl rings.

It will be appreciated that a number of other optional ingredients can be included in the compositions as well. Typical optional ingredients include surfactants, catalysts, and adhesion promoters.

The method of applying the inventive compositions to a substrate simply comprises applying a quantity of a composition hereof to the substrate surface by any known application method (including spin-coating). The substrate can be any conventional chip (e.g., silicon wafer) or an ion implant layer.

After the desired coverage is achieved, the resulting layer should be heated to induce crosslinking (e.g., to a temperature of from about 100-250° C.). At a film thickness of about 40 nm and a wavelength of about 248 nm, the cured layers will have a k value (i.e., the imaginary component of the complex index of refraction) of at least about 0.3, and preferably at least about 0.45, and an n value (i.e., the real component of the complex index of refraction) of at least about 1.0, and preferably at least about 1.8. That is, a cured layer formed from the inventive composition will absorb at least about 90%, and preferably at least about 99% of light at a wavelength of about 248 nm. This ability to absorb light at DUV wavelengths is a particularly useful advantage of the inventive compositions.

A photoresist can then be applied to the cured material, followed by exposing, developing, and etching of the photoresist. Following the methods of the invention will yield precursor structures which have the foregoing desirable properties.

It will further be appreciated that the cured inventive composition is wet developable. That is, the cured composition can be removed with conventional aqueous developers such as tetramethyl ammonium hydroxide or potassium hydroxide developers. At least about 90%, and preferably at least about 98% of the inventive coatings will be removed by a base developer such as a tetramethyl ammonium hydroxide developer (e.g., OPD262, available from Olin Photodeveloper). This percent solubility in commercially-available developers is a significant advantage over the prior art as this shortens the manufacturing process and makes it less costly.

Finally, in addition to the many advantages described above, the present composition is spin bowl compatible. This is determined as described in Example 2, using PGMEA as the solvent and taking five measurements to determine the average thicknesses. The percent solubility is calculated as follows:

$$\% \text{ solubility} = \left[ \frac{(\text{ave. initial sample thickness} - \text{ave. final sample thickness})}{(\text{initial sample thickness})} \right] * 100.$$

The inventive compositions show a percent solubility of at least about 50%, and more preferably at least about 90%.

DETAILED DESCRIPTION OF THE PREFERRED EMBODIMENTS

EXAMPLES

Figure 1:
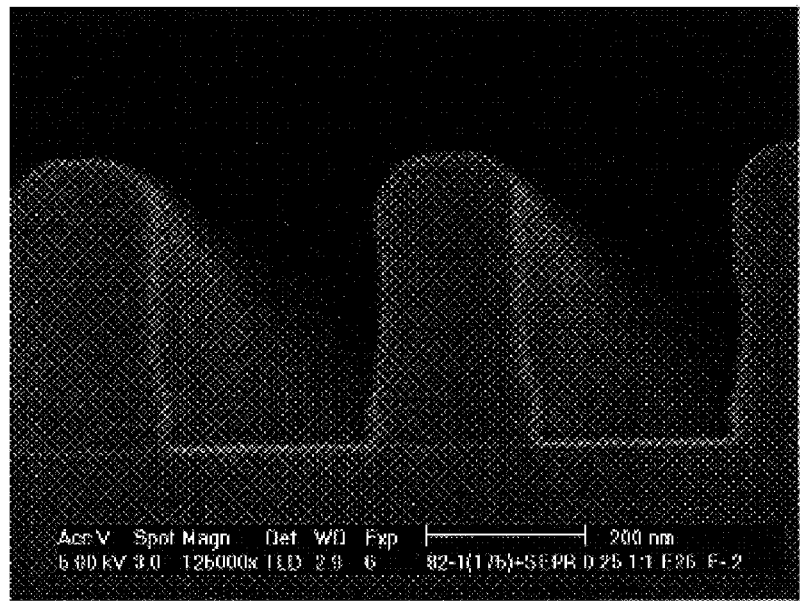
FIG. 1 is a Scanning Electron Micrograph (SEM) depicting a cross-sectional view of a circuit structure showing how a wet developable anti-reflective layer is removed when the photoresist is developed.
Figure 2:
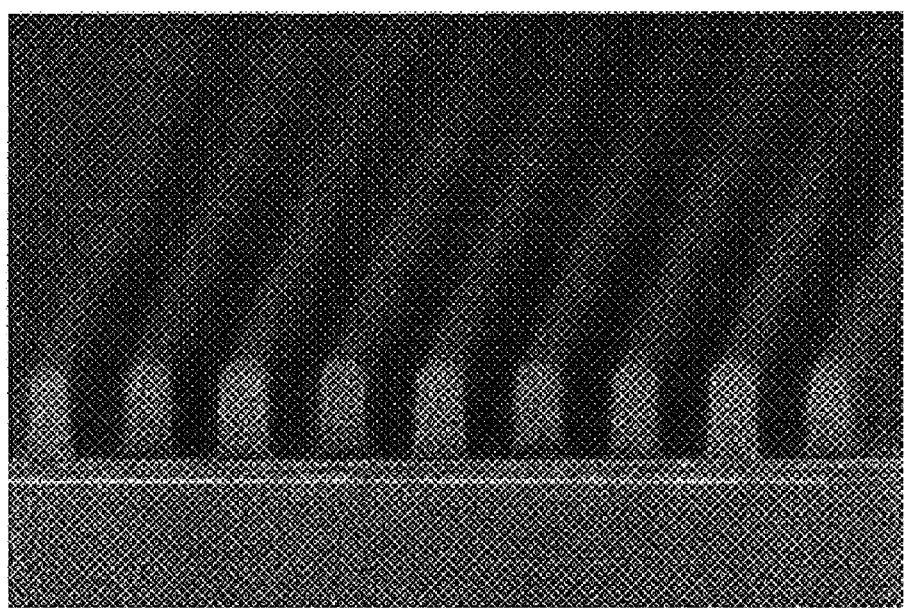
FIG. 2 is an SEM of a cross-section of a circuit structure showing how a conventional thermosetting anti-reflective layer remains when the photoresist is developed.

The following examples set forth preferred methods in accordance with the invention. It is to be understood, however, that these examples are provided by way of illustration and nothing therein should be taken as a limitation upon the overall scope of the invention.

Example 1

Preparation of Anti-Reflective Coating Composition

1. Polymer Preparation

A polyamic acid was produced by combining 4,4'-diaminodiphenyl sulfone (4,4'-DPS), 3,3'-dihydroxybenzidene (HAB), and 4,4'-hexafluoroisopropylidene dipthalic anhydride (6FDA) (each obtained from KrisKev Corporation) at a molar ratio of 0.46:0.46:1. These ingredients were combined at 60° C. in diacetone alcohol (obtained from Aldrich). The mixture was stirred overnight and resulted in a dark brown, viscous liquid having a solids content of 10% by weight.

2. Anti-Reflective Coating Preparation

The ingredients of Table 1 were mixed to yield an anti-reflective coating composition.

TABLE 1

| Formulation I | Percentage By Weight[a] |
|---|---|
| Polymer from Part 1 of this Example | 1.58% |
| PGMEA[b] | 48.50% |
| Diacetone alcohol | 48.5% |
| 3,7-dihydroxy-2-napthoic acid | 0.95% |
| Crosslinking Agent[c] | 0.47% |

[a]Based upon the total weight of all ingredients in the composition taken as 100% by weight.
[b]propylene glycol monomethyl ether acetate.
[c]MY720, a tetra functional epoxy resin available from Araldite; diluted 50% by weight in diacetone alcohol.

TABLE 2

| Formulation II | Percentage By Weight |
|---|---|
| Polymer from Part 1 of this Example | 1.23% |
| PGMEA | 48.80% |
| Diacetone alcohol | 48.8% |
| 3,7-dihydroxy-2-napthoic acid | 0.74% |
| Crosslinking Agent | 0.43% |

TABLE 3

| Formulation III | Percentage By Weight |
|---|---|
| Polymer from Part 1 of this Example | 1.20% |
| PGMEA | 48.50% |
| Diacetone alcohol | 48.5% |
| 3,7-dihydroxy-2-napthoic acid | 0.72% |
| Crosslinking Agent | 0.48% |

TABLE 4

| Formulation IV | Percentage By Weight |
|---|---|
| Polymer from Part 1 of this Example | 2.25% |
| PGMEA | 47.75% |
| Diacetone alcohol | 47.75% |
| 3,7-dihydroxy-2-napthoic acid | 1.35% |
| Crosslinking Agent | 0.90% |

Example 2

Testing Methods and Results

1. GPC Analysis

The polymers prepared in Part 1 of this example were analyzed to determine molecular weight using HPLC with an attached gel permeation column where n-methyl pyrillidone with tetrahydrofuran were used as the mobile phase. The polymer prepared in Part 1 of Example 1 had a molecular weight of 24,908 and a molecular number of 13,462.

2. Spin Bowl/Solvent Compatibility Test

Each of the four formulations prepared in Part 2 of Example 1 was subjected to a spin bowl/solvent compatibility test. This test was carried out by spin-coating the composition onto five 4" silicon wafers for each sample. After spin-coating, the resulting layer was allowed to dry for 24 hours at ambient conditions. At that time, the average initial film thickness on each wafer was determined using a Stokes ellipsometer. After determining the thicknesses, each wafer was soaked with a different solvent (acetone, ethyl lactate, PGMEA, propylene glycol monomethyl ether (PGME), and 2-heptanone) for 180 seconds, followed by spin drying at 3500 rpm. The respective average final film thicknesses were then remeasured using a Stokes ellipsometer. The final thickness measurements of the samples showed that 100% of the anti-reflective coating layers had been removed for each solvent.

3. Film Stripping Test

Each of the anti-reflective coating compositions prepared in Part 2 of Example 1 were subjected to a film stripping test to determine the amount of interaction between typical photoresist solvents and the underlying anti-reflective coating layer. In this test, a 4" silicon wafer was coated with the particular anti-reflective coating formulation followed by baking at 130° C. for 30 seconds and a second bake at 150° C. for 60 seconds. The film thickness was then measured using a Stokes ellipsometer. After measuring the thickness, the wafer was sprayed with ethyl lactate. The resulting puddle was allowed to stand on the wafer for 10 seconds followed by spin-drying of the wafer at 3500 rpm for 20 seconds. The wafer was then remeasured with a Stokes ellipsometer to determine the film thickness. The amount of stripping is the difference between the initial and final film thickness measurements. The percent stripping is $$\% \text{ stripping} = \left( \frac{\text{amount of stripping}}{\text{initial average film thickness}} \right) \times 100.$$

Compositions according to the invention will give a percent stripping of less than about 20%, and preferably less than about 5%. Each of these formulations exhibited no stripping at bake temperatures of 150-205° C.

4. V.A.S.E. Measurements

In this procedure, 4" silicon wafers were individually coated with each of the formulations from Part 2 of Example 1. The respective refractive indices (i.e., n value) and imaginary refractive indices (i.e., k value) were determined using variable angle spectrophotometric ellipsometery. Each formulation showed an n value of 1.1 and a k value of 0.45 at 248 nm.

5. Photolithography

Figure 3:
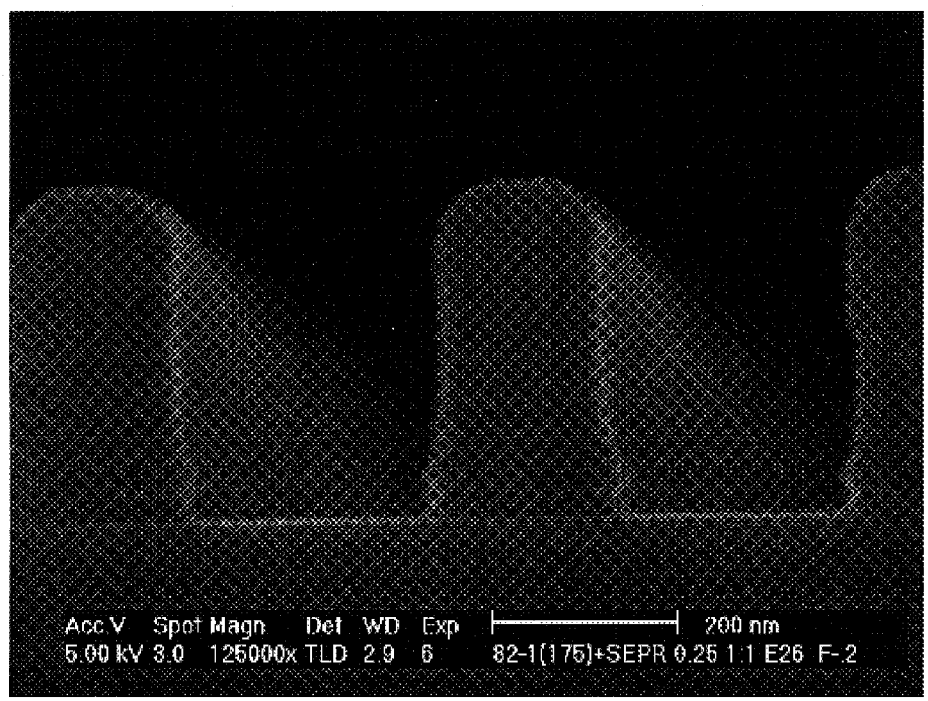
FIG. 3 an SEM depicting a cross-sectional view of a circuit structure showing how a wet developable anti-reflective layer according to the invention is removed when the photoresist is developed.

The formulations of Part 2 of Example 1 were spin-coated onto respective 8" silicon substrate at 3500 rpm for 60 seconds, yielding a film having a thickness of 40 nm. The films were then baked at 130° C. for 30 seconds, followed by 175° C. bake for 60 seconds. A commercially available, 500 nm photoresist (SEPR430, available from Shinetsu) was spin-coated on each anti-reflective coating layer followed by a soft bake at 90° C. The photoresist was then patterned with lines and spaces using an ASML 5500/300 stepper with NANA of 0.63 and annular illumination with outer sigma of 0.87 and inner sigma of 0.57. After a KrF excimer laser exposure of 26 mj/cm², the photoresist was baked at 110° C. for 90 seconds. The photoresist and the anti-reflective coating layer were then developed using a 0.26 N tetramethyl ammonium hydroxide aqueous developer (available under the name OPD262). A cross-sectional view of one of the sample wafers is shown in FIG. 3.

We claim:

1. In a composition for use in photolithographic processes wherein the composition comprises a polymer dissolved or dispersed in a solvent system, the improvement being that said composition comprises a thermal crosslinking agent and said polymer is a copolymer of a compound having the formula

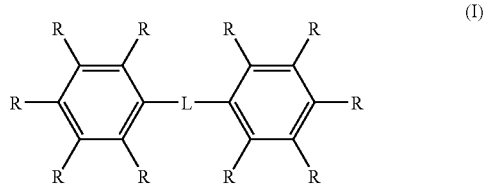

and a compound having the formula

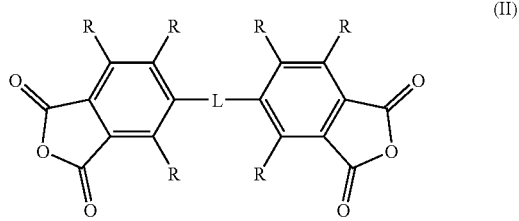

wherein:
each R is individually selected from the group consisting of —OH, —NH₂, hydrogen, aliphatics, and phenyls, at least one R on each ring of (I) being —NH₂, and at least one R on each ring of (I) being —OH; and
L is selected from the group consisting of —SO₂— and —CR'₂—, where each R' is individually selected from the group consisting of hydrogen, aliphatics, phenyls, and —CX₃, where each X is individually selected from the group consisting of the halogens, wherein said composition can be formed into a layer that will absorb at least about 90% of light having a wavelength of about 248 nm at a thickness of about 40 nm.

2. The composition of claim 1, wherein at least one L is —SO₂—.

3. The composition of claim 1, wherein at least one L is —CR'₂—.

4. The composition of claim 3, each R' is —CF₃.

5. The combination of:
a substrate having a surface; and
a cured anti-reflective layer adjacent said surface, said anti-reflective layer being formed from a composition comprising a thermal crosslinking agent and a polymer dissolved or dispersed in a solvent system, said polymer being a copolymer of a compound having the formula

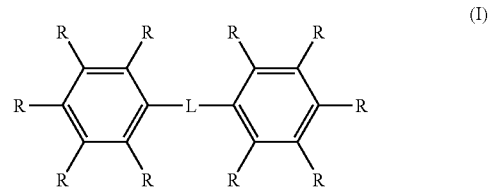

and a compound having the formula

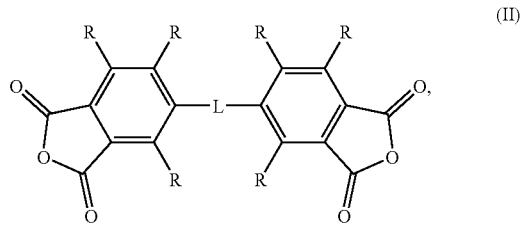

wherein:
each R is individually selected from the group consisting of —OH, —NH₂, hydrogen, aliphatics, and phenyls, at least one R on each ring of (I) being —NH₂, and at least one R on each ring of (I) being —OH; and
L is selected from the group consisting of —SO₂— and —CR'₂—, where each R' is individually selected from the group consisting of hydrogen, aliphatics, phenyls, and —CX₃, where each X is individually selected from the group consisting of the halogens,
wherein said layer absorbs at least about 90% of light having a wavelength of about 248 nm at a thickness of about 40 nm.

6. The combination of claim 5, said cured layer being wet developable.

7. The combination of claim 5, wherein said cured layer has a percent solubility of at least about 50% when propylene glycol methyl ether acetate is the solvent.

8. The combination of claim 5, wherein said substrate is selected from the group consisting of silicon wafers and ion implant layers.

9. The combination of claim 5, said combination further comprising a photoresist layer adjacent said cured layer.

10. The combination of claim 5, said cured layer being at least about 90% soluble in a base developer.

11. The combination of claim 5, wherein at least one L is —SO₂—.

12. The combination of claim 5, wherein at least one L is —CR'$_2$—.

13. The combination of claim 12, wherein each R' is —CF$_3$.

14. A method of using a composition in photolithographic processes, said method comprising the steps of:
applying a quantity of a composition to a substrate; and
heating said composition to induce crosslinking and form a cured layer thereon, said composition comprising a thermal crosslinking agent and a polymer dissolved or dispersed in a solvent system, said polymer being a copolymer of a compound having the formula

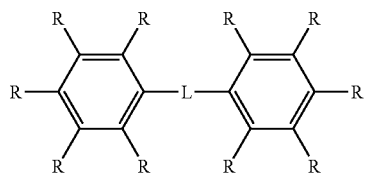

(I)

and a compound having the formula

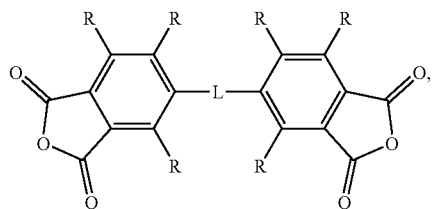

(II)

wherein:
each R is individually selected from the group consisting of —OH, —NH$_2$, hydrogen, aliphatics, and phenyls, at least one R on each ring of (I) being —NH$_2$; and
L selected from the group consisting of —SO$_2$— and —CR'$_2$—, where each R' is individually selected from the group consisting of hydrogen, aliphatics, phenyls, and —CX$_3$, where each X is individually selected from the group consisting of the halogens,
said cured layer absorbing at least about 90% of light having a wavelength of about 248 nm at a thickness of about 40 nm.

15. The method of claim 14, wherein said applying step comprises spin-coating said composition onto said substrate surface.

16. The method of claim 14, wherein said substrate has a hole formed therein, said hole being defined by a bottom wall and sidewalls, and said applying step comprises applying said composition to at least a portion of said bottom wall and sidewalls.

17. The method of claim 14, wherein said heating comprises baking said layer at a temperature of from about 100-250° C.

18. The method of claim 17, further including the step of applying a photoresist to said cured layer.

19. The method of claim 18, furthering including the steps of:
exposing at least a portion of said photoresist to activating radiation; and
developing said exposed photoresist.

20. The method of claim 19, wherein said developing step results in the removal of said cured layer from areas adjacent said exposed photoresist.

21. The combination of:
a substrate having a surface; and
an anti-reflective layer adjacent said surface, said anti-reflective layer being formed from a composition comprising a thermal crosslinking agent and a polymer dissolved or dispersed in a solvent system, said polymer being a copolymer of a compound having the formula

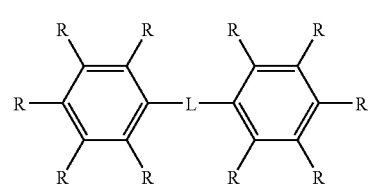

(I)

and a compound having the formula

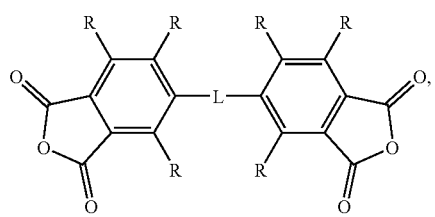

(II)

wherein:
each R is individually selected from the group consisting of —OH, —NH$_2$, hydrogen, aliphatics, and phenyls, at least one R on each ring of (I) being —NH$_2$ and at least one R on each ring of (I) being —OH; and
L is selected from the group consisting of —SO$_2$— and —CR'$_2$—, where each R' is individually selected from the group consisting of hydrogen, aliphatics, phenyls, and —CX$_3$, where each X is individually selected from the group consisting of the halogens.

22. A method of using a composition in photolithographic processes, said method comprising the step of applying a quantity of a composition to a substrate to form a layer thereon and heating said composition to induce crosslinking, wherein:
said composition comprises a thermal crosslinking agent and a polymer dissolved or dispersed in a solvent system, said polymer being a copolymer of a compound having the formula

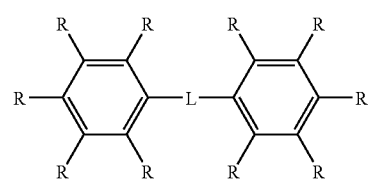

(I)

and a compound having the formula

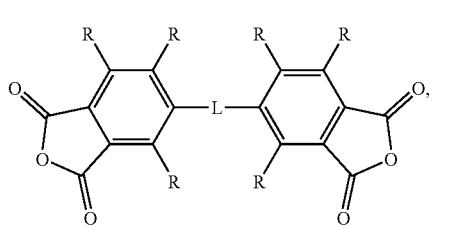

wherein:
  each R is individually selected from the group consisting of —OH, —NH$_2$, hydrogen, aliphatics, and phenyls, at least one R on each ring of (I) being —NH$_2$; and
  L is selected from the group consisting of —SO$_2$— and —CR'$_2$—, where each R' is individually selected from the group consisting of hydrogen, aliphatics, phenyls, and —CX$_3$, where each X is individually selected from the group consisting of the halogens;
  said substrate has a hole formed therein, said hole being defined by a bottom wall and sidewalls; and
  said applying step comprises applying said composition to at least a portion of said bottom wall and sidewalls.

23. A method of using a composition in photolithographic processes, said method comprising the step of applying a quantity of a composition to a substrate to form a layer thereon and heating said composition to induce crosslinking, said composition comprising a thermal crosslinking agent and a polymer dissolved or dispersed in a solvent system, said polymer being a copolymer of a compound having the formula

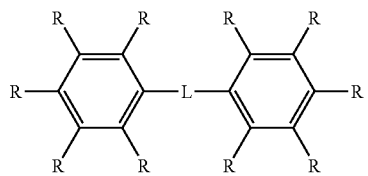

and a compound having the formula

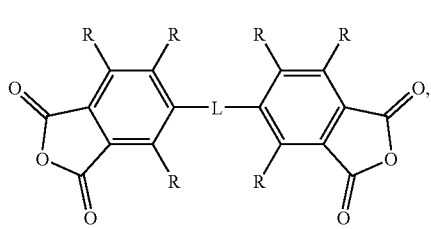

wherein:
  each R is individually selected from the group consisting of —OH, —NH$_2$, hydrogen, aliphatics, and phenyls, at least one R on each ring of (I) being —NH$_2$; and
  L is selected from the group consisting of —SO$_2$— and —CR'$_2$—, where each R' is individually selected from the group consisting of hydrogen, aliphatics, phenyls, and —CX$_3$, where each X is individually selected from the group consisting of the halogens, said layer absorbing at least about 90% of light having a wavelength of about 248 nm at a thickness of about 40 nm
wherein said substrate has a hole formed therein, said hole being defined by a bottom wall and sidewalls, and said applying step comprises applying said composition to at least a portion of said bottom wall and sidewalls.

24. The method of claim 23, wherein said heating comprises baking said layer at a temperature of from about 100-250° C. to yield a cured layer, said method further including the steps of:
  applying a photoresist to said cured layer;
  exposing at least a portion of said photoresist to activating radiation; and
  developing said exposed photoresist, wherein said developing step results in the removal of said cured layer from areas adjacent said exposed photoresist.

25. A method of using a composition in photolithographic processes, said method comprising the steps of:
  applying a quantity of a composition to a substrate to form a layer thereon, said composition comprising a thermal crosslinking agent a polymer dissolved or dispersed in a solvent system, said polymer being a copolymer of a compound having the formula

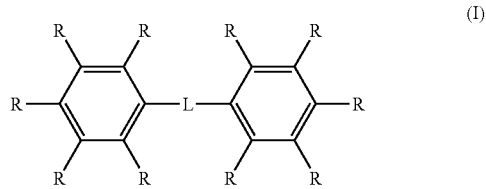

and a compound having the formula

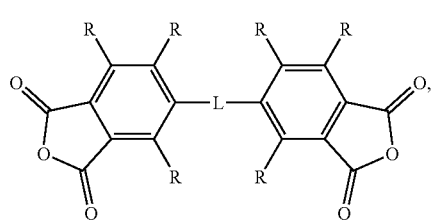

wherein:
  each R is individually selected from the group consisting of —OH, —NH$_2$, hydrogen, aliphatics, and phenyls, at least one R on each ring of (I) being —NH$_2$; and
  L is selected from the group consisting of —SO$_2$— and —CR'$_2$—, where each R' is individually selected from the group consisting of hydrogen, aliphatics, phenyls, and —CX$_3$—, where each X is individual selected form the group consisting of the halogens;
  curing said layer to form a cured layer;
  applying a photoresist to said cured layer;
  exposing at least a portion of said photoresist to activating radiation; and
  developing said exposed photoresist, wherein said developing step results in the removal of said cured layer from areas adjacent said exposed photoresist.

* * * * *